United States Patent [19]

Mannette et al.

[11] Patent Number: 5,751,772
[45] Date of Patent: May 12, 1998

[54] METHOD FOR LOCATING A CHANNEL IN A COMMUNICATION SYSTEM

[75] Inventors: Michael Russell Mannette, Bloomingdale; Camille Louise Dozier, Schaumburg; Tom Nguyen, Streamwood, all of Ill.

[73] Assignee: Motorola, Inc., Schaumburg, Ill.

[21] Appl. No.: 608,374

[22] Filed: Feb. 28, 1996

[51] Int. Cl.$^6$ .......................... H04L 27/06; H04L 27/14; H04L 27/22

[52] U.S. Cl. .................. 375/316; 455/161.2; 455/164.1; 455/166.1; 455/168.1; 370/343

[58] Field of Search ................... 375/316; 455/161.1, 455/161.2, 164.1, 166.1, 166.2, 168.1, 188.1; 348/731, 732; 370/330, 343, 344, 480, 485

[56] References Cited

U.S. PATENT DOCUMENTS

| | | | |
|---|---|---|---|
| 5,161,023 | 11/1992 | Keenan | 455/161.1 |
| 5,457,816 | 10/1995 | Koyama | 455/161.2 |
| 5,551,071 | 8/1996 | Nakano et al. | 455/166.2 |
| 5,574,995 | 11/1996 | Masaki | 455/161.2 |

*Primary Examiner*—Don N. Vo
*Attorney, Agent, or Firm*—Aaron Bernstein; Jordan C. Powell

[57] ABSTRACT

A method for locating a carrier (220) includes the steps of tuning to a first anticipated carrier location (240) within a first subband division (216), attempting to locate the carrier (220) at the first anticipated carrier location (240) within the first subband division (216), tuning to a second anticipated carrier location (223) within a second subband division (217) if failing to locate the carrier in the first subband division (216), and attempting to locate the carrier (220) at the second anticipated carrier location (223) within the second subband divisions (217).

15 Claims, 3 Drawing Sheets

METHOD FOR LOCATING A CHANNEL IN A COMMUNICATION SYSTEM

BACKGROUND

The present invention relates, in general, to communication systems, and more particularly to communication systems requiring locating a channel in a spectrum.

Typically, subscriber units in communications systems must locate a Radio Frequency (RF) carrier signal in a larger RF spectrum. Additionally, in some systems, the subscriber-unit must find a particular Time Division Multiple Access (TDMA) channel on the particular RF carrier. The channel may have on it system information that the subscriber unit requires, or the channel may be the channel that the subscriber unit will communicate on. Conventionally, the desired channel will have some sort of identifying information on it so that the subscriber unit recognizes that the subscriber unit has found the right channel once that channel is acquired. Conventionally, in order to find such a channel, the subscriber unit sequentially searches all possible frequencies and time slot combinations to locate the desired channel. This scanning search results in long acquisition times. In many systems, the prolonged acquisition times translate to increased power-up times where the channel must be found at power-up, and increased perceivable outage times where the channel must be found after a system failure. Therefore, there exists a need for a method to quickly locate a channel in a communication system.

DETAILED DESCRIPTION OF THE DRAWINGS

Generally, the present invention provides a method for quickly locating a system channel in a telephony cable system. In the preferred embodiment, the system channel is one Time Division Multiple Access TDMA channel on a system carrier, which is radio frequency carrier used by the communication system. The system channel carries information needed by a subscriber unit for the subscriber unit to interact with the communication system. One preferred method of the invention takes advantage of typical allocation of telephony channels within a cable communication system which also delivers video programming. Telephony channels are typically grouped together and placed in frequency subbands which take the place of one or more of the available video channels, because of the desire to utilize as few video channels as possible for telephony. The time required to locate system channels is reduced by searching only portions of the frequency spectrum of the subbands for a system carrier and only continuing to search for a system channel within a subband if a system carrier is found.

Figure 1:
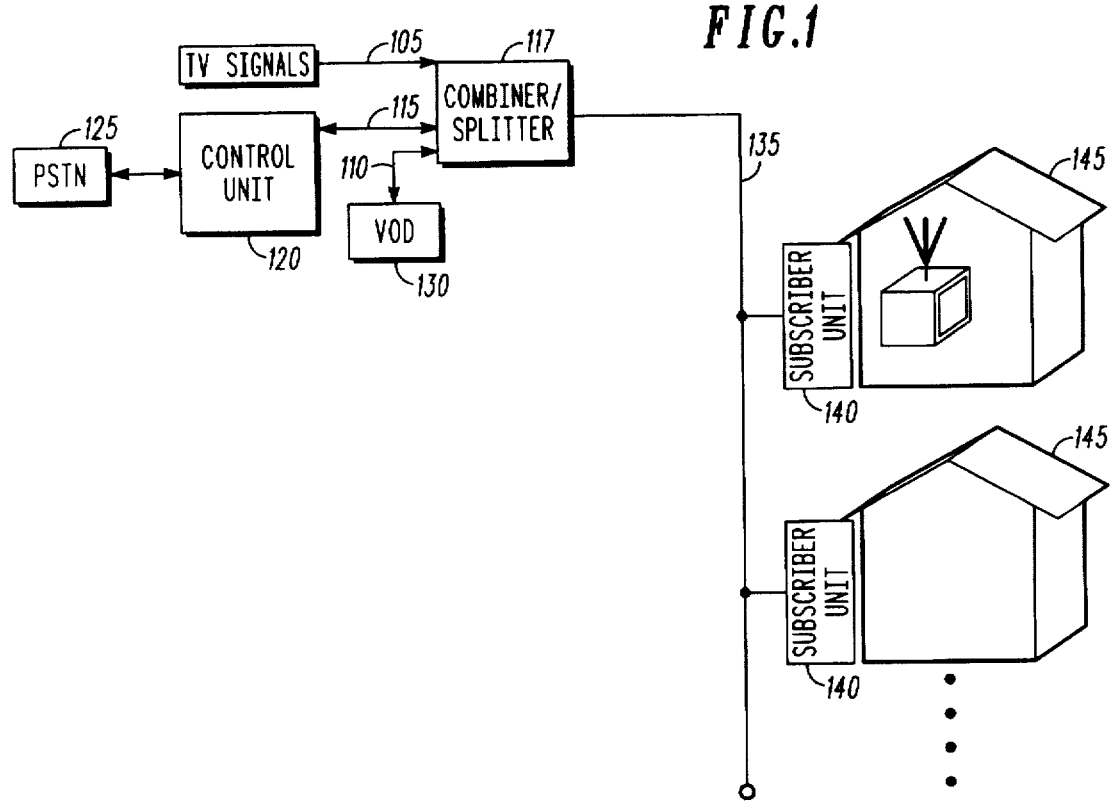
FIG. 1 is a schematic diagram of a communication system using cable infrastructure.

FIG. 1 shows a cable communication system 100 that could advantageously use the invention of this application. Television signals 105, video on demand (VOD) signals 110 and telephone signals 115 are coupled to a combiner/splitter 117. A control unit 120 provides data and telephony service to the communication system 100 and access to a PSTN 125. A VOD system 130 controls and originates the video services 110 for the subscribers of the communication system 100. The signals from the combiner/splitter 117 are carried by, preferably, hybrid fiber cable (HFC) 135 to the subscriber units 140. However, the cable may consist of any other suitable medium such as low-loss coaxial cable or fiber optic cable. The subscriber units 140 couple to a wide variety of devices within the subscriber premises 145 such as televisions, telephones, computers, utility management devices, wireless data ports and set-top boxes. The signals are transmitted to the subscriber units 140 utilizing a downstream frequency band and signals that are transmitted from the subscriber units 140 to the control unit 120 use an upstream frequency band within the frequency spectrum.

Figure 2:
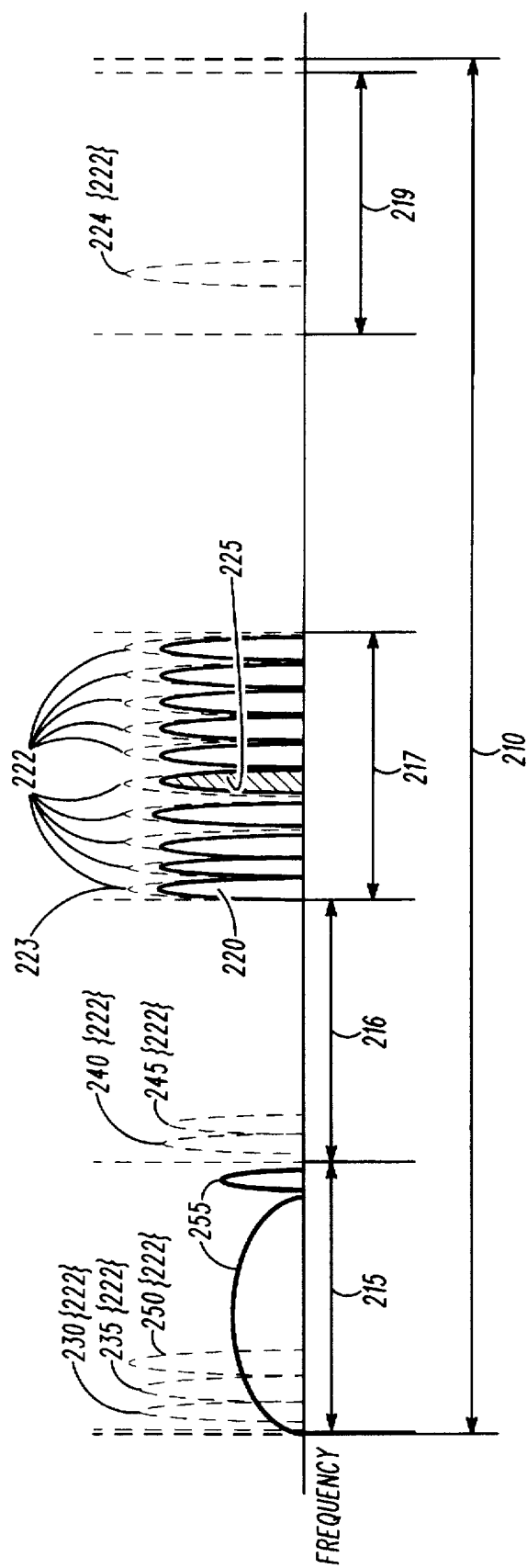
FIG. 2 is a graphical representation of a frequency spectrum.

A graphical representation of the frequency spectrum is depicted in FIG. 2. The downlink frequency band utilized by the cable communication system is defined by a radio frequency band 210. In the preferred embodiment of the invention the radio frequency band 210 spans from 50 MHz to 750 MHz and is divided into a plurality of sequential subband divisions 215–219. The sequential subband divisions 215–219 are typically 6 to 10 MHz wide and are defined by the particular communication system 100. Each sequential subband division 215–219 may include a complete video carrier 255 or system carriers 220. The number and location of the subband divisions 217 utilized for telephony and data service is determined by the particular communication system 100. The arrangement of the system carriers 220 within the subband division 217 is also dictated by the particular communication system 100 and is represented, by dotted line system carrier locations 222 in FIG. 2. In the preferred embodiment of the invention, the carriers are typically 600 khz wide and evenly spaced within the subband division 217. However, system carriers 220 need not be present at every designated system carrier location 222 in the subband division 217. When a subscriber unit 140 initially enters the communication system 100, such as during initial powerup or after a power outage, the subscriber unit 140 typically does not initially know which subband divisions 215–219 contain the system carriers 220 or which system carrier locations 222 contain system carriers 220. However, the subscriber unit 140 does have access to information relating to the location of the system carrier locations 222.

In the preferred embodiment of the invention, one or more system carriers 220 will contain a system channel that includes information the subscriber unit may require when communicating in the communication system. The systems carrier 220 containing the system channel is represented by the solid line carrier labeled 225. The subscriber unit is unaware, prior to accessing a system channel, of which system carrier 220 contains the system channel or of the location of the system channel on the system carrier 225.

Figure 3:
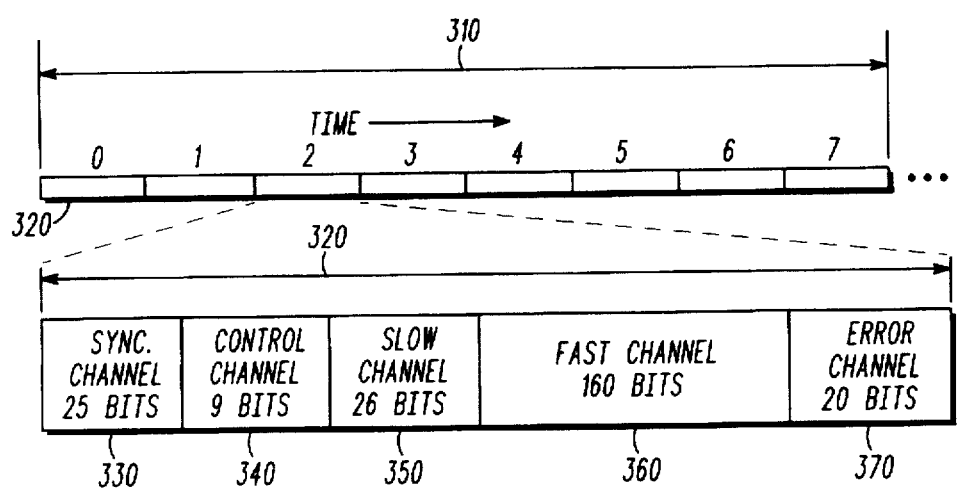
FIG. 3 is a block diagram of a TDM frame structure.

FIG. 3 is a block diagram which represents the downlink TDM frame structure 300 transmitted on the system carrier 220 by the control unit 120. The frame 310 is 2.5 ms long and consists of eight time slots 320 that are 312.5 micro seconds long and contain 240 bits. Each time slot 320 consists of a synchronization channel 330, a control channel 340, a slow channel 350, a fast channel 360, and an error channel 370. The synchronization channel 330 is a unique code of 25 bits which provides for frame synchronization. The control channel 340 contains information on the frame number 310, timeslot number 320, and control flags. The slow channel 350 contains message based control information and the system channel identifier. The fast channel 360 typically contains bearer information such as audio or data, but may also contain information on signaling and control. The error channel 370 provides error detection.

Figure 4:
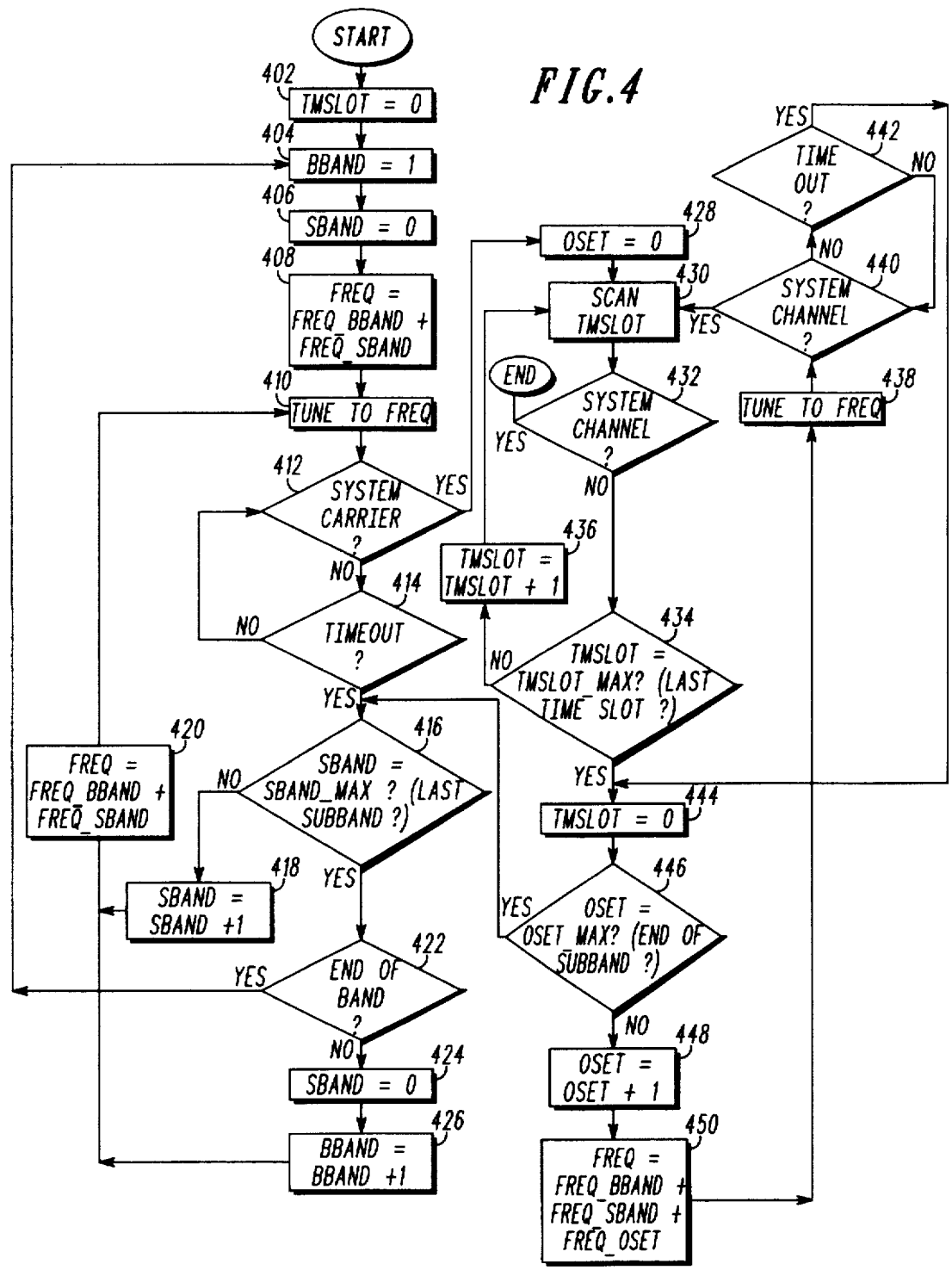
FIG. 4 is a flow chart illustrating a method for locating a channel.

The flowchart of FIG. 4 provides an overview of the operation of the preferred embodiment of the present invention. The preferred embodiment begins at step 402 where TMSLOT is set equal to zero. TMSLOT corresponds to the time slot 320. At step 404, the baseband is set to the first scan frequency by setting BBAND equal to 1. Each increment in BBAND corresponds to an offset in frequency equal to the bandwidth of a carrier location. The first subband to be scanned is set at step 406 by setting SBAND equal to zero. At step 408, FREQ is set to a frequency equal to the sum of the frequency corresponding to BBAND and the frequency corresponding to SBAND. At step 410, the subscriber unit 140 is tuned to FREQ. The subscriber unit 140 then scans the frequency and time slot by demodulating the incoming signal using known techniques at step 412. The subscriber unit 140 compares the sync channel 330 of the time slot 320 to a stored sequence. If the sync channel is not detected or, in other words, if the a system carrier is not detected, the procedure continues at step 414 where it is determined if a time limit has been reached. If the time limit has not been reached, the scanning is continued at step 412. This loop continues until either the system carrier is detected (discussed further below) or the time limit is reached. If the time limit is reached, the procedure moves to step 416 where it is determined if the current subband is the last subband. If it is not the last subband, the subband is changed by incrementing SBAND by 1 in step 418. The new scan frequency is calculated at step 420 and the procedure returns to step 410. If it is determined at step 416 that the last subband has been reached, the procedure continues to step 422 where it is determined if the last carrier location within the radio frequency band has been reached. This is accomplished by determining if BBAND is equal to BBAND__MAX where BBAND_MAX is equal to the number of carrier locations in a subband. If the end of the band (i.e. last carrier location) has been reached the procedure returns to step 404. If the end of the band has not been reached, SBAND is reset to zero at step 424, BBAND is incremented by 1 at step 426 and the procedure continues at step 420. Essentially steps 424, 426, and 420 allow for the procedure to set to the next carrier location 222 within a subband. Steps 404 through 426 continue until a system carrier is detected.

Returning now to step 412, if a system carrier is detected, the procedure continues to step 428 where OSET is set to zero. OSET corresponds to the anticipated carrier location within the subband and will be discussed in more detail below with reference to step 448. At step 430, the time slot is scanned by decoding the time slot and reading the slow channel 350. At step 432, it is determined if a system channel has been located by determining if the slow channel 350 information indicates that the particular channel is a system channel. The procedure is complete if a system channel is found. If a system channel is not found, the procedure continues to step 434. At step 434, it is ascertained if the current time slot is the last time slot in the frame by determining if TMSLOT is equal to TMSLOT_MAX at step 434. If it is determined that the last time slot has been reached the procedure continues to step 444. If the last time slot is not reached, then the procedure continues to step 436 where the time slot is changed by incrementing TMSLOT by 1 and then returns to step 430. Steps 430 through 436 are performed until a system channel is located or the last time slot on the system carrier is reached. If the last time slot is reached, the procedure continues to step 444. TMSLOT is reset to zero at step 444. At step 446, it is determined if the end of the subband has been reached by comparing OSET to OSET_MAX. If the end of the subband has been reached, the procedure returns to step 416. Otherwise, OSET is incremented by 1 at step 448. OSET corresponds to an offset in frequency which, when used to calculate FREQ, determines the anticipated system carrier location that will be scanned. Each increment of OSET corresponds to a frequency change equal to the bandwidth of a system carrier location 222. At step 450, the FREQ is calculated by summing the frequencies corresponding to BBAND, SBAND, and OSET. At step 438, the subscriber unit tunes to the new frequency corresponding to FREQ. The attempt to locate a system carrier in steps 438 through 442 is performed in the same manner as described for steps 410 through 414. If a system carrier is not located and the time limit is reached, the procedure returns to step 444.

The following example is included as an additional aid in assisting the reader to gain a clear understanding of the invention. Assume the subscriber unit has recently lost power and must now locate a system carrier and a system channel in order to begin communicating on the communication system 100. Referring to FIG. 2 and FIG. 4, the subscriber unit 140 first initializes the time slot parameter in step 402. Subscriber unit 100 then sets the BBAND to 1 which in the case of this example corresponds to the frequency band including subband division 216 through subband division 219 (for ease of explanation, subband 215 is left out of this example). The subscriber unit then by setting SBAND equal to zero, initializes the subband parameter to the first of the plurality of subband divisions to be searched. For purposes of clarity, subband 216, in this example, is the first of the plurality of subband divisions. It will be understood that any subband in the communication may be a first of the plurality of subband divisions and any remaining subband, after the first is defined, may be a second of the plurality of subband divisions. The subscriber tunes to the proper frequency at step 410 which corresponds to the first of anticipated carrier locations 240. Since a carrier 220 is not present in the carrier location 240, the subscriber unit scans the carrier location until a time out condition occurs at step 414. The subscriber unit determines that the end of the subband has not been reached at step 416 and therefore, increments the SBAND by 1 (step 418). After calculating the new FREQ at step 420, the subscriber unit tunes to the new frequency which now corresponds to the second of anticipated carrier locations 223 at step 410. This time when the subscriber unit attempts to locate a carrier 220 it is successful since the carrier is present in the carrier location 223. However, the system channel that the subscriber unit must locate is not on the carrier 220. Therefore, the subscriber unit must find an anticipated carrier location 222 which contains the system carrier which in this case is the fifth carrier location 222 and contains the system carrier 225. The subscriber unit first must determine that the present carrier does not contain the system channel. This is accomplished by first setting the offset to zero at step 428, then scanning the first time slot at step 430, attempting to locate the system channel at step 432, reaching a time out condition at step 434, incrementing the time slot at step 430 and repeating the procedure until all the time slots have been scanned. When the last time slot on the carrier 223 has been checked, the subscriber unit resets the first time slot at step 444. The subscriber unit then increments OSET by 1 at step 448. This results in the new frequency calculated at step 450 to be offset by an amount equal to the bandwidth of a carrier location 222. The subscriber unit then tunes to the new frequency at step 438 which is the second carrier location in the subband 217. A system carrier is detected at step 440 so the subscriber unit scans the time slots as described previously. The subscriber unit continues to scan the time slots on the carriers 220 and increment OSET until the system channel is located.

Consequently, a method has been disclosed for quickly locating a system channel in a communication system. The invention takes advantage of the grouping of system carriers by scanning only one carrier location of a subband, then scanning a carrier location of a second subband if the carrier is not found. The process continues until the first carrier location is scanned in all the subbands. If the carrier has not been located at that point the next carrier location is checked in each of the subbands. This process continues until a carrier is located. The method then limits the search for the system channel to the remainder of the subband and searches the next subband only after failing to locate the system channel. The clear advantage of the invention, is that time is not wasted searching spectrum that likely does not contain the desired channel.

While the invention has been particularly shown and described with reference to a preferred embodiment, it is understood that various changes in the form and detail may be made therein without departing form the spirit and scope of the invention. For example, although the depicted system carriers, subbands and basebands are increasing, the process may be implemented by decreasing system carriers, subbands and basebands.

What is claimed is:

1. A method for locating a carrier in a radio frequency spectrum comprising the steps of:

providing a radio frequency band comprising a plurality of sequential subband divisions sized to be capable of containing a plurality of the carriers, the radio frequency band further including a plurality of anticipated carrier locations;

tuning to a first single anticipated carrier location within a first of the plurality of sequential subband divisions;

attempting to locate the carrier at the first single anticipated carrier location within the first of the plurality of sequential subband divisions;

in response to failing to locate the carrier at the first single anticipated carrier location within the first of the plurality of sequential subband divisions, tuning to a second single anticipated carrier location within a second of the plurality of sequential subband divisions;

attempting to locate the carrier at the second single anticipated carrier location within the second of the plurality of sequential subband divisions;

in response to locating the carrier at the second single anticipated carrier location within the second of the plurality of sequential subband divisions, attempting to locate a specific channel on the carrier: and in response to failing to locate the specific channel, tuning to a third single anticipated carrier location within the second of the plurality of sequential subband divisions.

2. The method of claim 1, further including: attempting to locate a second carrier at the third single anticipated carrier location within the second of the plurality of sequential subband divisions; and attempting to locate the specific channel on the second carrier.

3. The method of claim 1, wherein the specific channel comprises a Time Division Multiple Access (TDMA) time slot.

4. The method of claim 1, wherein the specific channel comprises a system information bearing channel.

5. The method of claim 1, further comprising:

in response to failing to locate the carrier at the second single anticipated carrier location within the second of the plurality of sequential subband divisions;

tuning to a next of the plurality of anticipated carrier locations within a next of the plurality of sequential subband divisions;

attempting to locate the carrier at the next anticipated carrier location within the next of the plurality of sequential subband divisions; and in response to failing to locate the carrier at the next anticipated carrier location within the next of the plurality of sequential subband divisions, continuing to tune to a subsequent next of the plurality of anticipated carrier locations within a subsequent next of the plurality of sequential subband divisions and attempting to locate the carrier at a subsequent next single anticipated carrier location within the subsequent next of the plurality of sequential subband divisions.

6. The method of claim 5 wherein the step of continuing to tune to a subsequent next of the plurality of anticipated carrier locations within a subsequent next of the plurality of sequential subband divisions and attempting to locate the carrier at the subsequent next anticipated carrier location within the subsequent next of the plurality of sequential subband divisions is continued until the carrier is located.

7. The method of claim 5, further comprising, in response to failing to locate the carrier at the subsequent next anticipated carrier location within the subsequent next of the plurality of sequential subband divisions, tuning to a third single anticipated carrier location within a first of the plurality of sequential subband divisions, the third single anticipated carrier located a carrier bandwidth from the first single anticipated carrier, and attempting to locate the carrier at the third single anticipated carrier location within the first of the plurality of sequential subband divisions.

8. The method of claim 2, further comprising:

in response to failing to locate the specific channel on the second carrier;

tuning to a next of the plurality of anticipated carrier locations within the second of the plurality of sequential subband divisions;

attempting to locate a next carrier at the next anticipated carrier location within the second of the plurality of sequential subband divisions;

attempting to locate the specific channel on the next carrier within the second of the plurality of sequential subband divisions; and in response to failing to locate the specific channel on the next carrier within the second of the plurality of sequential subband divisions, continuing to tune to a subsequent next of the plurality of anticipated carrier locations within the second of the plurality of sequential subband divisions.

9. A method for locating a carrier in a radio frequency spectrum comprising the steps of:

providing a radio frequency band comprising a plurality of sequential subband divisions sized to be capable of containing a plurality of the carriers;

tuning to a first single anticipated carrier location within a first of the plurality of sequential subband divisions;

attempting to locate the carrier at the first single anticipated carrier location within the first of the plurality of sequential subband divisions;

in response to failing a locate the carrier at the first single anticipated carrier location within the first of the plurality of sequential subband divisions, tuning to a second single anticipated carrier location within a second of the plurality of sequential subband divisions;

attempting to locate the carrier at the second single anticipated carrier location within the second of the plurality of sequential subband divisions;

in response to locating the carrier at the second single anticipated carrier location within the second of the plurality of sequential subband divisions, attempting to locate a specific channel on the carrier;

in response to failing to locate the carrier at the second single anticipated carrier location within the second of the plurality of sequential subband divisions, tuning to a third single anticipated carrier location offset by a carrier bandwidth from the first single anticipated carrier location within the first of the plurality of sequential subband divisions; and attempting to locate the carrier at the third single anticipated carrier location within the first of the plurality of sequential subband divisions.

10. The method of claim 9, further including, in response to failing to locate the carrier at the third single anticipated carrier location within the first of the plurality of sequential subband divisions;

tuning to a fourth single anticipated carrier location offset by the carrier bandwidth from the second single anticipated carrier location within the second of the plurality of sequential subband divisions; and attempting to locate the carrier at the fourth single anticipated carrier location within the second of the plurality of sequential subband divisions.

11. A method comprising the steps of:

scanning a first of a series of potential carrier locations of a first subband of a frequency band to detect if any of a number of system carriers is in the first of the series of potential carrier locations;

determining if a system channel is located within the first of the series of potential carriers if any of the number of system carriers is detected in the first of the series of potential carriers;

scanning successively through the series of potential carrier locations of the first subband to detect the system channel if any of the number of system carriers is detected in the first of the series of potential carriers; and if one of the number of system carriers is not detected in the first of a series of potential carrier locations of the first subband, then further comprising the steps of:

scanning a first of a series of potential carrier locations of a second subband of the frequency band to detect if any of the number of system carriers is in a first of a series of potential carrier locations of the second subband; and scanning successively through the series of potential carrier locations of the second subband to detect the system channel if any of the number of system carriers is detected in the first of the series of potential carriers of the second subband.

12. A method according to claim 11 wherein if one of the number of system carriers is not detected in the first of a series of potential carrier locations of the second subband, then further comprising the steps of:

scanning a first of a series of potential carrier locations of a subsequent subband of the frequency band to detect if any of the number of system carriers is in the first of the series of potential carrier locations of the subsequent subband; and scanning successively through the series of potential carrier locations of the subsequent subband to detect the system channel if any of the number of system carriers is detected in the first of the series of potential carriers of the subsequent subband.

13. A method according to claim 12 wherein if one of the number of system carriers is not detected in the first of a series of potential carrier locations of the subsequent subband, then further comprising the steps of:

scanning a second of a series of potential carrier locations of the first subband of the frequency band to detect if any of the number of system carriers is in the second of the series of potential carrier locations of the first subband; and scanning successively through the series of potential carrier locations of the first subband to detect the system channel if any of the number of system carriers is detected in the second of the series of potential carriers of the first subband.

14. A method according to claim 13 wherein if one of the number of system carriers is not detected in the second of a series of potential carrier locations of the first subband, then further comprising the steps of:

scanning a second of a series of potential carrier locations of the second subband of the frequency band to detect if any of the number of system carriers is in the second of the series of potential carrier locations of the second subband; and scanning successively through the series of potential carrier locations of the second subband to detect the system channel if any of the number of system carriers is detected in the second of the series of potential carriers of the second subband.

15. A method according to claim 11 wherein the step of determining if a system channel is located within the first of the series of potential carriers comprises scanning through a number of time slots of each of the series of potential carriers to determine if the system channel is located within any of the series of potential carriers.

* * * * *